United States Patent [19]

Desai et al.

[11] Patent Number: 6,030,887
[45] Date of Patent: Feb. 29, 2000

[54] FLATTENING PROCESS FOR EPITAXIAL SEMICONDUCTOR WAFERS

[75] Inventors: Ankur H. Desai, St. Peters; David L. Vadnais, St. Charles; Robert W. Standley, Chesterfield, all of Mo.

[73] Assignee: MEMC Electronic Materials, Inc., St. Peters, Mo.

[21] Appl. No.: 09/030,894

[22] Filed: Feb. 26, 1998

Related U.S. Application Data

[60] Provisional application No. 60/043,741, Apr. 3, 1997.

[51] Int. Cl.$^7$ .................................................. H01L 21/20
[52] U.S. Cl. ...................... 438/507; 438/478; 438/504; 438/974
[58] Field of Search .................... 148/33, 33.4; 356/371; 438/478, 481, 503, 504, 507, 974

[56]  References Cited

U.S. PATENT DOCUMENTS

| | | | |
|---|---|---|---|
| 4,877,479 | 10/1989 | McNeil et al. | 156/626 |
| 5,238,532 | 8/1993 | Zarowin et al. | 156/643 |
| 5,254,830 | 10/1993 | Zarowin et al. | 219/121.43 |
| 5,290,382 | 3/1994 | Zarowin et al. | 156/345 |
| 5,291,415 | 3/1994 | Zarowin et al. | 364/474.3 |
| 5,292,400 | 3/1994 | Mumola | 156/643 |
| 5,372,674 | 12/1994 | Steinberg | 156/643 |
| 5,375,064 | 12/1994 | Bollinger | 364/474.3 |
| 5,376,224 | 12/1994 | Zarowin | 156/643 |
| 5,419,803 | 5/1995 | Mumola . | |
| 5,449,638 | 9/1995 | Hong et al. | 437/61 |
| 5,474,647 | 12/1995 | Poultney et al. | 156/626.1 |
| 5,491,571 | 2/1996 | Williams et al. | 359/59 |
| 5,543,919 | 8/1996 | Mumola | 356/382 |
| 5,563,709 | 10/1996 | Poultney | 356/371 |

FOREIGN PATENT DOCUMENTS

| | | |
|---|---|---|
| 668614 A2 | 8/1995 | European Pat. Off. . |
| 741406 A2 | 11/1996 | European Pat. Off. . |
| 798405A2 | 1/1997 | European Pat. Off. ........ C30B 33/00 |
| 798766A1 | 1/1997 | European Pat. Off. ...... H01L 21/304 |
| 57202734 | 12/1982 | Japan . |
| 04226031 | 8/1992 | Japan . |
| 06295891 | 10/1994 | Japan . |

OTHER PUBLICATIONS

G. Pfeiffer, "Final Polish For SOI Wafters–Surface Roughness and TTV Degradation", Proceedings 1995 IEEE International SOI Conference, pp. 172–173, 1995.

Aug. 17, 1998 PCT International Search Report (PCT/US98/06531).

F. Shimura, "Semiconductor Silicon Crystal Technology", Academic Press, pp. 191–195, 1989.

Primary Examiner—Chandra Chaudhari
Assistant Examiner—K Christianson
Attorney, Agent, or Firm—Senniger, Powers, Leavitt & Roedel

[57]  ABSTRACT

Process for the preparation of an epitaxial wafer having a total thickness variation and/or site total indicated reading of less than about 1.0 μms. The distance between the front and back surfaces of the epitaxial wafer at discrete positions on the front surface is measured to generate thickness profile data. Additional stock is removed from the front surface of the epitaxial wafer in a stock removal step to reduce the thickness of the epitaxial wafer to the target thickness, $T_t$, with the amount of stock being removed at each of said discrete positions being determined after taking into account the thickness profile data and $T_t$.

46 Claims, 2 Drawing Sheets

FLATTENING PROCESS FOR EPITAXIAL SEMICONDUCTOR WAFERS

This application claims benefit of Provisional App. Ser. No. 60/043,741 filed Apr. 3, 1997.

BACKGROUND OF THE INVENTION

The present invention relates to a process for flattening an epitaxial semiconductor wafer. In particular, the present invention provides a process for improving the global flatness and/or local site flatness of an epitaxial semiconductor wafer comprising a substrate wafer and one or more layers of material deposited on that substrate wafer. It further provides populations of epitaxial semiconductor wafers resulting from this process.

Epitaxy is an important process in the semiconductor material industry for achieving the necessary electrical properties of the semiconductor material. For example, a lightly doped epitaxial layer grown over a heavily doped substrate permits a CMOS device to be optimized for latch up immunity as a result of low resistance of the substrate. Other advantages, such as precise control of the dopant concentration profile and freedom from oxygen are also achieved.

Epitaxial semiconductor wafers used as starting materials for the fabrication of integrated circuits must meet certain surface flatness requirements. Such epitaxial wafers must be particularly flat in order to print circuits on the wafer by, for example, an electron beam-lithographic or photolithographic process. Flatness of the epitaxial wafer in the focal point of the electron beam delineator or optical printer is important for uniform imaging in the electron beam-lithographic and photolithographic processes. The flatness of the epitaxial wafer surface directly impacts device line width capability, process latitude, yield and throughput. The continuing reduction in device geometry and increasingly stringent device fabrication specifications are forcing manufacturers of semiconductor wafers to prepare increasingly flatter epitaxial wafers.

Epitaxial wafers can be characterized for flatness in terms of a global flatness variation parameter (for example, total thickness variation ("TTV") or Total Indicated Reading ("TIR")) or in terms of a local site flatness variation parameter (for example, Site Total Indicated Reading ("STIR") or Site Focal Plane Deviation ("SFPD")). A more detailed discussion of the characterization of wafer flatness can be found in F. Shimura, *Semiconductor Silicon Crystal Technology* (Academic Press 1989), pp. 191–195.

TTV, frequently used to measure global flatness variation, is the difference between the maximum and minimum thicknesses of the epitaxial wafer. TTV in the wafer is an important indicator of the quality of the polish of the wafer. STIR (back reference center focus), frequently used to measure local site flatness variation, is the sum of the maximum positive and negative deviations of the surface in a small area of the epitaxial wafer from a reference plane which is parallel to the back surface of the wafer and intersects the front surface at the center of the local site. A conventional polished epitaxial semiconductor wafer typically will have a TTV exceeding about 0.7 $\mu$m and a STIR (back reference center focus) exceeding about 0.5 $\mu$m for any 25 mm×30 mm local site. Such values, however, depend upon actual process conditions and often are significantly larger than 0.7 $\mu$m or 0.5 $\mu$m. Unless otherwise expressly noted, all STIR values discussed herein are based on a back reference center focus reference plane.

In general, epitaxial layers are formed by means such as chemical vapor deposition (CVD), molecular-beam epitaxy (MBE), thermal evaporation or sputtering of silicon under high vacuum conditions. Chemical vapor deposition is commonly used because it is the most flexible and cost efficient method for growing epitaxial layers on semiconductor material. Generally speaking, chemical vapor deposition involves introduction of volatile reactants (e.g., $SiCl_4$, $SiHCl_3$, $SiH_2Cl_2$ or $SiH_4$) with a carrier gas (usually hydrogen) into an epitaxial reactor containing a semiconductor wafer or wafers. A layer of the epitaxial material is deposited on the wafer surface. Among the factors affecting epitaxial layer growth on the wafer substrate are the type of reactor, temperature, pressure, gas flow rates and gas flow patterns. Illustrative processes for the preparation of epitaxial semiconductor wafers are disclosed in, for example, U.S. Pat. Nos. 4,926,793; and 4,925,809.

Epitaxial semiconductor wafers prepared according to conventional epitaxy techniques generally have an epitaxial layer thickness in the range of about 1 $\mu$m to about 100 $\mu$m. The TTV and STIR of a conventional epitaxial wafer typically have values equal to about 1% to about 20% of the thickness of the epitaxial layer. As the thickness of the epitaxial layer increases, the TTV and STIR of the epitaxial wafer generally increase.

Conventional epitaxial techniques do not uniformly deposit the epitaxial layer. For example, epitaxial wafers prepared in a single wafer reactor generally exhibit a radial variation in flatness. In addition, as the thickness of the epitaxial layer grows, it becomes increasingly more difficult to maintain a uniformly flat epitaxial wafer. Therefore, there is a need for new methods capable of further improving the flatness of an epitaxial semiconductor wafer, and/or the yield of a given production run, over conventional values. In addition, there is a need for methods capable of reducing the overall demands and disadvantages of conventional epitaxial wafer preparation processes without degrading wafer flatness.

The process of the present invention uses the appropriate sequencing of an additional material removal tool, preferably a step employing a plasma assisted chemical etching removal tool, to improve the total thickness variation and/or yield of epitaxial semiconductor wafers.

Mumola, U.S. Pat. No. 5,419,803, discusses a method for planarizing microstructures. A microstructure or series of microstructures on a substrate surface is covered by a planarization layer of material which completely covers the microstructures. A plasma assisted chemical etching tool is then used to reduce the overcoat layer, particularly an oxide overcoat layer, to a desired minimum thickness measured with respect to the microstructure having the greatest height above the substrate surface.

Zarowin, et al., U.S. Pat. No. 5,254,830, discusses a method using a thickness measuring apparatus to generate profile data representing the point-by-point thickness of a semiconductor wafer, particularly the thickness of the silicon film of a silicon-on-insulator ("SOI") substrate. The profile data is processed to yield a dwell time versus position map for the entire surface measured. This map is then used to control the movement of a material removal tool over the surface to locally remove additional stock from the surface to produce a layer having a uniform thickness, particularly to produce an SOI wafer having a device layer with a uniform thickness.

Poultney, U.S. Pat. No. 5,563,709, discusses the use of a metrology apparatus, particularly an apparatus which uses Hartmann-Shack Sensor configurations, to measure the total thickness variation of wafers. The metrology apparatus is situated above a flattening apparatus, such as a plasma assisted chemical etching tool. The placement of the metrology apparatus above the flattening apparatus allows the metrology step and material removal step to occur at a single work station and eliminates the need for a sophisticated co-registration scheme for overlapping a metrology map into shaping station coordinates.

SUMMARY OF THE INVENTION

Among the several objects of this invention, therefore, may be noted the provision of a process for improving the flatness of an epitaxial semiconductor; a process for the preparation of an epitaxial semiconductor wafer having a total thickness variation less than about 1.0 $\mu$m; a process for the preparation of an epitaxial semiconductor wafer having a site total indicated reading less than about 1.0 $\mu$m; a process for improving the flatness of an epitaxial wafer by sculpting the surface of the wafer substrate prior to the growth of the epitaxial layer; a process for improving the yield of an epitaxial semiconductor wafer production run at a relatively low cost; and a process for flattening the edge crown or other selected regions on the surface of an epitaxial semiconductor wafer.

Briefly, therefore, the present invention is directed to a process for the preparation of an epitaxial semiconductor wafer having a total thickness variation and/or site total indicated reading of less than about 1.0 $\mu$m. An epitaxial layer is grown on a front surface of a wafer substrate forming an interface between the front surface and the lower surface of the epitaxial layer. The distance between the upper surface of the epitaxial layer and the back surface of the wafer substrate at discrete positions on the upper surface of the epitaxial layer is measured to generate thickness profile data, preferably using an ADE 9700 capacitance probe. Alternatively, other metrology methods (such as metrology apparatus capable of measuring light or acoustic wavefronts reflected by the upper surface of the epitaxial layer) which use other reference planes can be used to generate thickness profile data. Additional stock is then removed from the upper surface of the epitaxial layer, preferably through plasma assisted chemical etching, to reduce the total thickness of the epitaxial wafer at each discrete point to a target total thickness, $T_t$, with the amount of stock being removed at each of said discrete positions being determined after taking into account the thickness profile data and $T_t$. This sequencing and use of the additional material removal step results in the preparation of epitaxial wafers with flatness values and/or in yields superior to those currently attainable by conventional processes.

The present invention also is directed to a process wherein said stock removal is carried out based on a point-by-point thickness profile data average rather than point-by-point thickness profile data measured for each individual wafer prepared. Although the profile data average may be based on point-by-point thickness profile data from a single epitaxial semiconductor wafer, it preferably is generated by measuring and averaging point-by-point thickness profile data from at least two epitaxial semiconductor wafers prepared under conditions similar to those of the epitaxial wafer to be flattened. The stock removal step is then carried out substantially as discussed in the preceding paragraph based on the thickness profile data average rather than the thickness profile data for the individual epitaxial wafer actually flattened.

The present invention also is directed to a process in which the stock removal step is performed on the epitaxial wafer substrate prior to the growth of the epitaxial layer using the point-by-point thickness profile data average generated as discussed above. Using the thickness profile data average, stock is removed from the front surface of the wafer substrate to create a sculpted surface which is substantially the mirror image (or the inverse profile) of the theoretical epitaxial wafer surface represented by the thickness profile data average. After the substrate surface is sculpted, the epitaxial layer is grown in a conventional manner.

The present invention also is directed to a process in which stock is selectively removed from the upper surface of the epitaxial layer or the front surface of the wafer substrate. Point-by-point thickness profile data is generated for a selected region of the epitaxial wafer surface, particularly where the selected region is a peripheral surface region on which an edge crown is situated, and used to control the stock removal tool according to the algorithm discussed above. Alternatively, the stock removal can be based on a point-by-point thickness profile data average generated from a representative epitaxial wafer or sampling of epitaxial wafers. Additionally or alternatively, the periphery (or other desired region) of the front surface of the wafer substrate can be sculpted prior to the growth of the epitaxial layer in order to offset the undesired total thickness variation and/or site total indicated reading attributable to the selected surface region.

The present invention is also directed to a population of wafers consisting of at least 10 epitaxial wafers having an average total thickness variation and/or site total indicated reading which does not exceed about 1.0 $\mu$m, preferably about 0.7 $\mu$m, more preferably about 0.5 $\mu$m, still more preferably about 0.3 $\mu$m, and optimally about 0.2 $\mu$m.

Other objects and features will be in part apparent and in part pointed out hereinafter.

BRIEF DESCRIPTION OF THE DRAWINGS

Corresponding reference characters indicate corresponding parts throughout the several views of the drawings.

DESCRIPTION OF THE PREFERRED EMBODIMENTS

In accordance with the present invention it has been discovered that the global and/or local site flatness of an epitaxial semiconductor wafer as well as the yield for a given production run can be improved over conventional values by incorporating and appropriately sequencing an additional material removal step, preferably a plasma assisted chemical etching step, with the conventional processing steps. The flatness of the epitaxial wafer depends in part upon the flatness of the wafer substrate and the flatness of the epitaxial layer. Improving the wafer substrate flatness or the epitaxial layer flatness, or both, will improve the flatness of the epitaxial wafer. The material removal step, therefore, preferably is inserted into the epitaxial process after the conventional preparation of the wafer substrate and either prior to or after the growth of an epitaxial layer on the wafer substrate.

The rate at which silicon is deposited onto various portions of a wafer substrate during epitaxial growth is a sensitive function of, among other variables, the temperature profiles and gas flow patterns within the reactor. Attention must be paid to the adjustment of these flows and temperatures to produce the most uniform epitaxial layers. In practice, perfect uniformity is not achieved, and the epitaxial layer will vary in thickness over the surface of the wafer. In order to average out some of the variations in flows and temperatures, the susceptor and wafers are usually rotated during deposition. In single wafer reactors, the wafer is typically rotated about its center, producing a nearly radially symmetric thickness variation in the epitaxial layer. In batch reactors, the rotation axis generally does not coincide with a symmetry axis of the wafer, so the resulting epitaxial thickness variation on the wafer in not symmetric. In either case, the thickness variation is characteristic of the type of reactor and operating conditions and is fairly predictable.

The improved process permits the preparation of an epitaxial wafer with a total thickness variation ("TTV") and/or site total indicated reading ("STIR") below those values currently attainable through conventional processing. In addition, the insertion of the additional material removal step into the conventional epitaxial process can increase wafer yields for a given production run and relax the flatness requirements for the wafer substrate upon which the epitaxial layer is grown. It also can provide greater flexibility in selecting the process conditions for the growth of the epitaxial layer.

The process of the present invention employs as a starting material a semiconductor wafer substrate sliced from a single crystal ingot. Silicon is a preferred material for the wafer with the conductivity type and resistivity not being critical. The wafer may have any diameter and target thickness which is appropriate for a semiconductor application. For example, the diameter may be from 4 to 8 inches (100 to 200 mm) or greater and the thickness may be from 475 to 725 μm or greater, with the thickness typically increasing with increasing diameter. The wafer also may have any desired crystal orientation.

Figure 1:
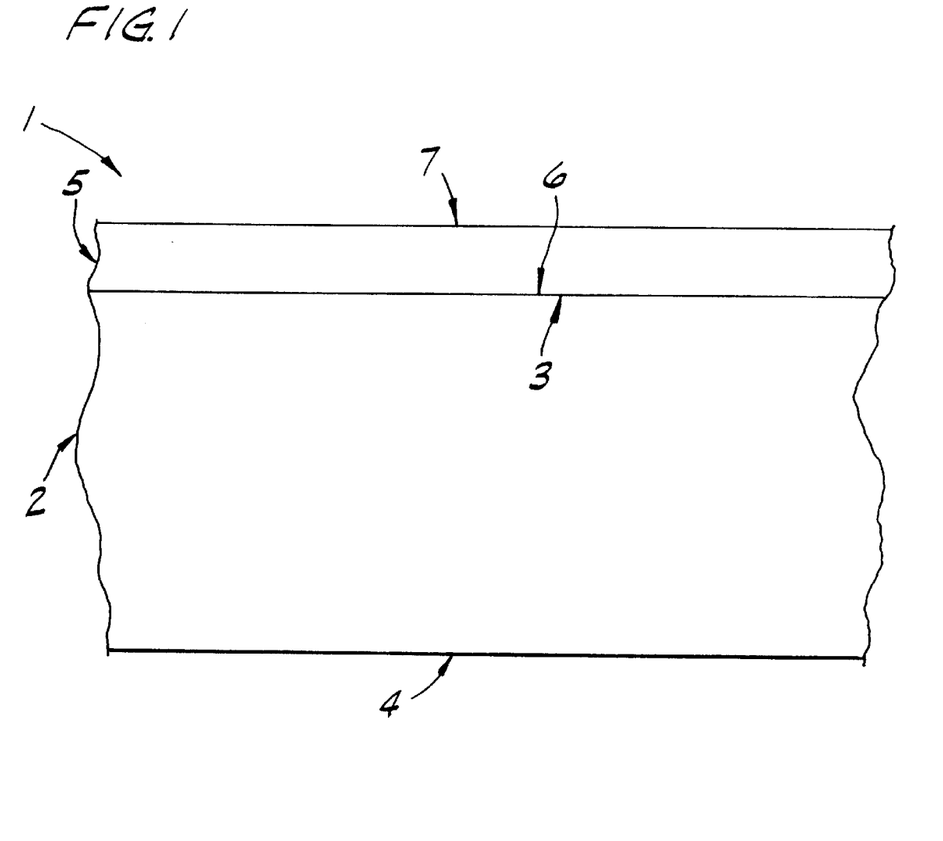
FIG. 1 is a schematic cross-sectional view of an epitaxial semiconductor wafer.

Referring now to FIG. 1, in a first embodiment, wafer substrate 2 is flattened to form an ultra-flat wafer. Preferably, the flattened wafer has a TTV of less than about 1 μm, more preferably a TTV of less than about 0.7 μm, still more preferably a TTV of less than about 0.5 μm, most preferably a TTV of less than about 0.2 μ, and optimally a TTV of less than about 0.1 μm. Alternatively or additionally, the flattened wafer preferably has a STIR of less than 1.0 μm, more preferably a STIR of less than about 0.7 μm, still more preferably a STIR of less than about 0.5 μm, most preferably a STIR of less than about 0.2 μm, and optimally a STIR of less than about 0.1 μm. Wafers meeting this flatness criteria may be prepared, for example, using the PACE-based technology disclosed in U.S. Pat. Nos. 4,668,366, 5,254,830, 5,291,415, 5,375,064, 5,376,224, and 5,491,571. Precision wafer shaping equipment using this technology is commercially available from IPEC/Precision (Bethel, Conn.) under the PWS-200 trademark.

Because the stock removal step in this embodiment of the invention removes material from the epitaxial layer of the epitaxial wafer, it generally results in the degradation of epitaxial layer thickness uniformity. While the additional stock removal step will flatten an epitaxial wafer prepared from a wafer substrate having a large TTV and/or STIR value, it also may reduce the thickness of the epitaxial layer below an acceptable minimum value at points corresponding to the peak locations of the wafer substrate if the TTV and/or STIR of the substrate is too large. Therefore, the TTV and/or STIR of the wafer substrate employed preferably is less than the variation in thickness uniformity of the epitaxial layer in order to avoid reducing epitaxial layer thickness below acceptable minimum values.

In general, the wafer substrate upon which the epitaxial layer is grown should preferably have a surface roughness (rms) of less than about 1.0 nm over an area of 1 mm×1 mm, more preferably about 0.5 nm over an area of 1 mm×1 mm, and most preferably about 0.25 nm over an area of 1 mm×1 mm. Plasma wafer-thinning processes, however, will typically leave the surface of the wafer substrate with a significant amount of surface roughness (rms) as measured, for example, with an Atomic Force Microscope (AFM). Thus, it is preferred that the roughness of the plasma thinned wafer substrate surface be reduced to a value which is less than that level of roughness.

This is conveniently done by a light polishing process referred to as a "kiss" polish. The algorithm to determine the amount of removal is as follows: (1) determine the peak ("p") to valley ("v") roughness of the plasma thinned surface, r(p-v); (2) design the polishing process to remove approximately 3r(p-v) to 4r(p-v) using a finishing type slurry (e.g., diluted Glanzox); and (3) conventional RCA type cleaning. Removing this small amount of silicon does not detract from the TTV and/or STIR of the wafer.

Taking into account the need to control TTV and/or STIR, wafer substrate 2 comprises any material which mechanically supports the other layer or layers, enables the handling and processing of the structure and does not constitute a source of contaminants for the epitaxial layer. Such materials include, for example, an elemental semiconductor material or a compound semiconductor material (or for non-epitaxial thin film depositions, materials such as polycrystalline silicon, a glass material such as quartz, or a ceramic material such as aluminum oxide, aluminum nitride or silicon carbide). Silicon is a preferred material for wafer substrate 2 with the conductivity type and resistivity not being critical.

Wafer substrate 2 having a front surface 3 and a back surface 4 is processed in a manner to form epitaxial layer 5 on front surface 3 wherein an interface is formed between front surface 3 and lower surface 6 of epitaxial layer 5. The thickness of epitaxial layer 5 will depend upon factors such as the type of material deposited, epitaxial reactor conditions and the device characteristics required. These factors can be manipulated to produce epitaxial layers of a desired thickness.

Preferably, epitaxial layer 5 is comprised of silicon. The material of epitaxial layer 5, however, may be selected from other materials such as, for example, silicon-germanium alloys. For a layer of silicon the thickness conventionally required will be between about 1.0 μm and about 100 μm, with thicknesses in the range of about 2.0 μm to about 25.0 μm being typical. In addition, although the epitaxial layer is preferably formed by chemical vapor deposition, other methods may be used to deposit epitaxial layer 5 on wafer substrate 2.

After epitaxial layer 5 is grown, point-by-point thickness profile data is generated for epitaxial semiconductor wafer 1 and mapped as a function of position on upper surface 7 of epitaxial layer 5 with data being generated at a sufficient number of discrete positions to assure full surface coverage for epitaxial wafer 1. The number of discrete positions, therefore, is at least 2, preferably at least 10, more preferably at least about 100, still more preferably at least about 1000 and, for some applications, most preferably at least about 5,000.

The thickness measurement tool used to generate this data may be a capacitance, optical interference, FTIR, or mechanical (e.g., micrometer) thickness measurement tool. Preferably, however, it is determined using a capacitance thickness measurement tool having a resolution of at least about 0.5 µm and more preferably a resolution of at least about 0.1 µm. A capacitance measurement tool having a resolution of about 0.1 to about 0.2 µm is commercially available from ADE Corporation (Newton, Mass.) under the ADE 7200 trademark. Preferably, however, the capacitance measurement tool is the ADE 9700. In operation, the introduction of a silicon wafer in the airgap of a parallel plate capacitor of these tools causes a change in capacitance. This capacitance change can be related to the thickness of the wafer and its effective dielectric constant.

The remaining discussion focuses on the use of a capacitance measurement tool for purposes of illustration. One skilled in the art can modify the embodiments disclosed herein to replace such capacitance measurement tools with other metrology apparatus known in the art and can measure flatness based on reference planes differing from those employed by capacitance measurement tools.

Significantly, the TTV and/or STIR of epitaxial wafer 1 can be calculated using an algorithm which operates on the thickness profile data and a target thickness value for the epitaxial wafer, $T_t$. For example, the amount of material to be removed can be determined by subtracting the target thickness, $T_t$, from the thickness profile data at each discrete position with the difference between the two values constituting the amount of stock which must be removed at each position on surface 6 of epitaxial layer 5 to achieve the target thickness, $T_t$, and thus minimize TTV and/or STIR.

If desired, the thickness of the wafer substrate, $T_{known}$, can be measured and this information included in the algorithm. For example, the algorithm can be modified to provide that the difference between the target thickness, $T_t$, and $T_{known}$ may not be less than a minimum value. Such a component in the algorithm would insure that the thickness of the epitaxial layer is not reduced below a minimum acceptable value at any discrete point.

Once the amount of material to be removed from each position on upper surface 7 of epitaxial layer 5 is determined, the material removal information is processed and converted to a dwell time versus position map which is used to control a stock removal tool during a stock removal step. This stock removal step may be executed using any tool which is capable of locally and precisely removing stock from small regions of upper surface 7 of epitaxial layer 5. The tool may be, for example, a chemical/mechanical polishing tool having micropolishing heads. Preferably, however, it is a PACE removal tool of the type previously described.

After the stock removal step, upper surface 7 of epitaxial layer 5 has a TTV of less than about 1.0 µm, more preferably a TTV of less than about 0.7 µm, still more preferably a TTV of less than about 0.5 µm, most preferably a TTV of less than about 0.2 µm, and optimally a TTV of less than about 0.1 µm. Alternatively or additionally, upper surface 7 of epitaxial layer 5 has a STIR of less than about 1.0 µm, more preferably a STIR of less than about 0.7 µm, still more preferably a STIR of less than about 0.5 µm, most preferably a STIR of less than about 0.3 µm, and optimally a STIR of less than about 0.1 µm. The final TTV and/or STIR value for the wafer is achieved by accurately mapping the thickness of epitaxial wafer 1 and precision thinning the wafer using this map in the stock removal step. During the stock removal step, preferably at least 1 µm of stock is removed from the epitaxial layer; more preferably at least about 2.0 µm, and most preferably at least about 4.0 µm of stock is removed during the stock removal step.

Prior to and/or after stock removal, epitaxial wafer 1 optionally may be cleaned to remove contaminants such as sulfur deposited on the wafer surface by the plasma during stock removal. Epitaxial wafer 1 may be cleaned using any suitable cleaning procedure that does not materially affect the thickness profile of the wafer. Such cleaning procedures are well known in the art and include, for example, the RCA method (described in F. Shimura, *Semiconductor Silicon Crystal Technology* (Academic Press 1989), pp. 189–191), or an appropriate water rinse.

After the stock removal step, upper surface 7 of epitaxial layer 5 may optionally and preferably be subjected to a "kiss" polish to reduce the surface roughness (rms) after the stock removal step. The procedure for the "kiss" polish is substantially the same as previously disclosed, although the polishing time may be further lengthened to reduce non-specularly reflected light (haze) and enhance the specularity of upper surface 7. An unpolished wafer includes high and low frequency components of roughness on its surface. The high frequency roughness causes high light scatter from the surface due to haze. The "kiss" polishing minimizes the high and low frequency surface roughness and reduces haze. Preferably, surface roughness is reduced to a value of less than about 1 Å over an area of 25 $\mu m^2$. In general, about 1 to about 300 nanometers of silicon will be removed in this polish step. After polishing, epitaxial wafer 1 optionally is subjected to a suitable cleaning procedure such as those conventional procedures discussed above in connection with the stock removal step.

Figure 2:
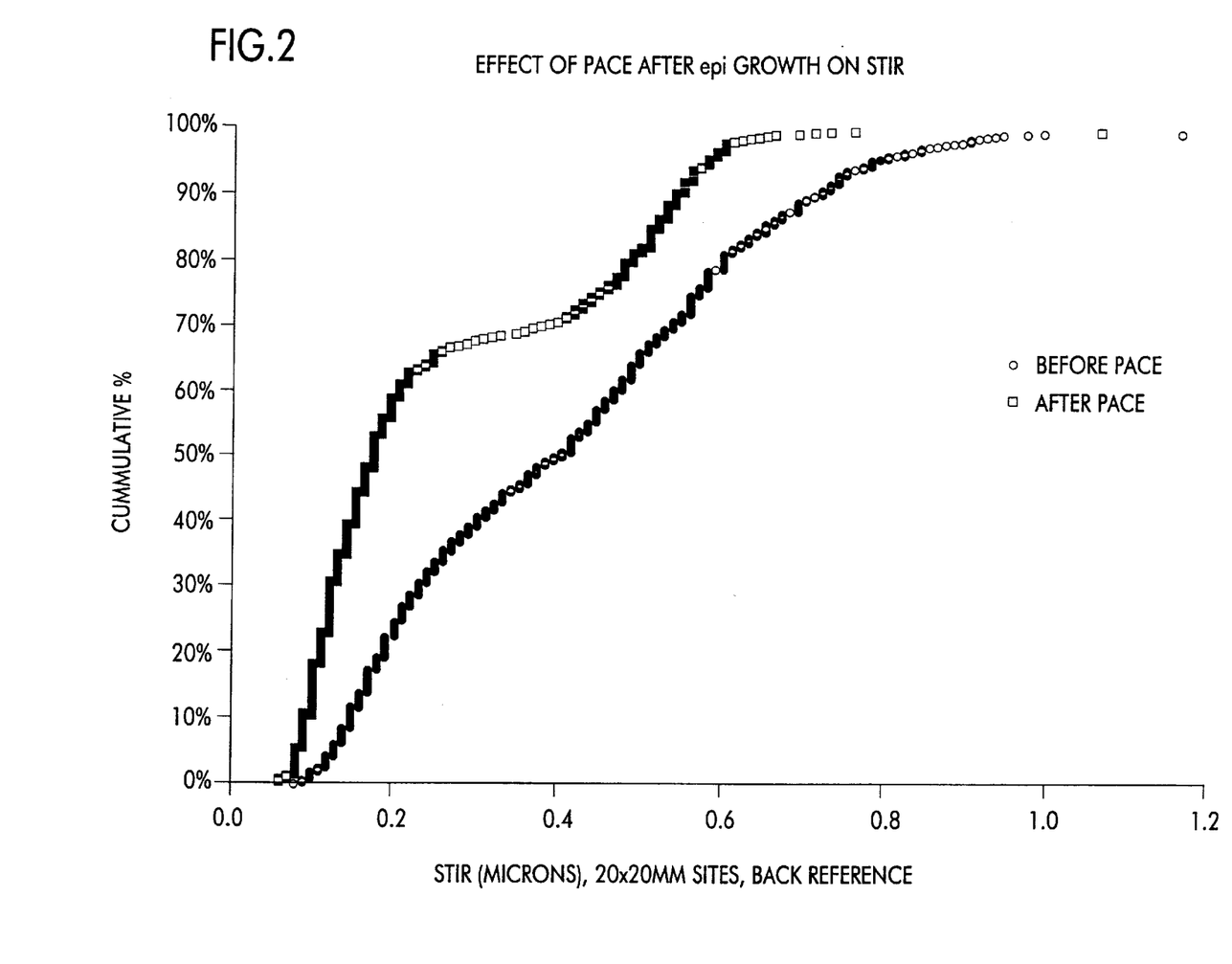
FIG. 2 is probability plot of the site flatness distribution for a group of epitaxial wafers subjected to plasma assisted chemical etching after growth of the epitaxial layer.

FIG. 2 illustrates the improvement in flatness according to this embodiment of the invention.

In another embodiment of this invention the stock removal step is performed on the basis of a point-by-point thickness profile data average rather than a point-by-point thickness profile data generated for each individual epitaxial wafer prepared. It has been discovered that epitaxial semiconductor wafers produced under substantially similar conditions in a specific epitaxial reactor using wafer substrates having substantially similar characteristics will exhibit a substantially identical and reproducible point-by-point total thickness variation pattern. Such patterns are particularly reproducible in single wafer reactors. Therefore, point-by-point thickness profile data for a representative epitaxial wafer or a selection of epitaxial wafers prepared under similar conditions can be generated to create a point-by-point thickness profile data average. For those epitaxial reactors producing epitaxial wafers exhibiting a highly reproducible TTV and/or STIR pattern, the point-by-point thickness profile data average actually may be based on data obtained from a single representative wafer prepared in the reactor rather than on an average of the data obtained from two or more epitaxial wafers. The number of epitaxial wafers measured to obtain the point-by-point thickness profile data average, therefore, is at least about 1, preferably at least about 5, more preferably at least about 10, and still more preferably at least about 25.

The amount of material to be removed to achieve the desired TTV and/or STIR value is calculated using an algorithm substantially identical to the one previously discussed operating on a target thickness and the thickness profile data average at each discrete position. This information is then processed and converted to a dwell time versus position map which is used to control the stock removal tool during the stock removal step. Epitaxial wafers prepared from the same epitaxial reactor, or from epitaxial reactors producing substantially similar TTV and/or STIR patterns, therefore, can be processed without using a metrology apparatus to generate point-by-point thickness profile data for each individual wafer once a thickness profile data average has been determined.

Referring again to FIG. 1, in another embodiment, the stock removal step is performed on front surface 3 of wafer substrate 2 prior to the growth of epitaxial layer 5 using the point-by-point thickness profile data average generated as discussed above. Stock is removed from front surface 3 of wafer substrate 2 in accordance with the thickness profile data average to sculpt front surface 3 of wafer substrate 2 wherein the sculpted surface is substantially a mirror image of the surface of the epitaxial layer of the wafer corresponding to the thickness profile data average. The sculpted surface substantially offsets the TTV and/or STIR normally present with respect to an epitaxial layer grown in accordance with this embodiment of the invention.

After front surface 3 of wafer substrate 2 is sculpted it is preferably "kiss" polished and epitaxial layer 5 is grown in a conventional manner. Finish polishing of the upper surface of the epitaxial layer typically is not necessary. If desired, however, upper surface 7 of epitaxial layer 5 can be subjected to an additional material removal step to further reduce the remaining TTV and/or STIR of the wafer. If this additional material removal step is carried out, upper surface 7 of epitaxial layer 5 preferably is subjected to a "kiss" polish as previously discussed once all material removal steps have been completed.

Alternatively, thickness profile data is generated for wafer substrate 2 and stock is removed from front surface 3 to prepare an ultra-flat surface rather than a sculpted surface. After front surface 3 of wafer substrate 2 is flattened, it is preferably "kiss" polished and epitaxial layer 5 is grown in a conventional manner.

Referring to FIG. 1 again, in another embodiment of the invention the edge crown of an epitaxial wafer is selectively removed. Gas flow over the edge of the wafer substrate during epitaxial growth typically creates an edge crown, or a raised region at the outer periphery of the front surface of the wafer substrate due to more rapid growth near the edge than over the rest of the substrate. The edge crown often accounts for the most significant TTV and/or STIR of the epitaxial wafer. This edge crown can be selectively removed in accordance with the embodiments of the invention discussed above.

Specifically, point-by-point thickness profile data can be generated for the periphery (or any selected region) of upper surface 7 of epitaxial layer 5 and used to control the stock removal tool in accordance with the algorithm and resulting dwell time versus position map discussed above. Alternatively, such stock removal can be performed based on a point-by-point thickness profile data average for the periphery generated for epitaxial wafers prepared under similar process conditions from wafer substrates which were not sculpted. In still yet another alternative, the periphery of front surface 2 of wafer substrate 1 can be sculpted prior to the growth of the epitaxial layer. Such sculpting results in sculpted front surface 3 which is convex at the periphery of wafer substrate 1. Epitaxial layer 5 is grown on sculpted front surface 3 of wafer substrate 1 resulting in the elimination or reduction of the TTV and/or STIR attributable to the edge crown. While these alternative embodiments illustrate selective stock removal with respect to the edge crown, such selective stock removal can be accomplished with respect to any discrete position or positions on the surface of the epitaxial layer or wafer substrate. Treatment of less than the entire surface of the epitaxial layer or wafer substrate may be desirable in order to reduce cycle time or where other processing benefits can be achieved.

In each of the above embodiments, it may be desirable prior to and/or after stock removal to optionally clean the corresponding epitaxial wafer 1 and/or wafer substrate 2 to remove contaminants such as slurry particles and metals introduced during the initial or intermediate processing steps and sulfur deposited on the wafer surface by the plasma during stock removal. Epitaxial wafer 1 and wafer substrate 2 may be cleaned using any suitable cleaning procedure that does not materially affect the thickness profile of the wafer. Such cleaning procedures are well known in the art and include, for example, the RCA method (described in F. Shimura, *Semiconductor Silicon Crystal Technology* (Academic Press 1989), pp. 189–191), or an appropriate water rinse. Similarly, after "kiss" polishing, it may be desirable to optionally subject epitaxial wafer 1 to a suitable cleaning procedure such those conventional procedures discussed above in connection with the stock removal step.

The various embodiments of the present invention offer particular advantages in the preparation of ultra-flat epitaxial wafers having a TTV and/or STIR of about 1.0 $\mu$m or lower. The process of the present invention also offers particular advantages in relaxing the TTV and/or STIR requirements for the wafer substrate upon which the epitaxial layer is grown.

It further offers particular advantages in the manipulation of conventional flattening, polishing and epitaxial layer growth steps. These advantages arise from the additional flexibility in selecting the various flattening, polishing and epitaxial growth variable values made possible by the incorporation of the additional material removal step.

In addition, yields approaching 100% are possible for flatness specifications as low as about 0.7 $\mu$m TTV and/or about 0.5 $\mu$m STIR. Consequently, these embodiments eliminate the need for flatness sorting of epitaxial wafers where the flatness specification only requires a TTV and\or STIR above about 0.7 $\mu$m and about 0.5 $\mu$m, respectively. Conventional wafer preparation processes require such flatness sorting.

Furthermore, the wafer flattening process of the present invention enables the preparation of a population of epitaxial semiconductor wafers having a tight distribution of TTV and/or STIR. That is, a population of at least about 10 substrates, preferably at least about 25 substrates, can be prepared having an average TTV and/or STIR for the wafer which does not exceed about 1.0 $\mu$m, preferably about 0.7 $\mu$m, more preferably about 0.5 $\mu$m, and optimally about 0.2 $\mu$m. In addition, populations of such wafers can be prepared wherein the minimum thickness of the epitaxial layer is not less than 2.0 $\mu$m at all positions of the epitaxial layer.

While the embodiments discussed above focus on the flattening of single-layer epitaxial wafers, one skilled in the art can modify the embodiments to apply to the flattening of multi-layered epitaxial wafers. Similarly, while the embodiments discussed above focus on flattening epitaxial wafers to achieve a TTV and/or STIR value within the preferred ranges discussed herein, one skilled in the art can modify the embodiments to prepare for epitaxial wafers having larger TTV and/or STIR values if less limiting flatness specifications apply, particularly for TTV and/or STIR values less than about 5 $\mu$m.

In view of the above, it will be seen that the several objects of the invention are achieved and other advantageous results attained.

As various changes could be made in the above constructions and processes without departing from the scope of the invention, it is intended that all matter contained in the above description or shown in the accompanying drawings shall be interpreted as illustrative and not in a limiting sense.

What is claimed is:

1. A process for the preparation of an epitaxial wafer having a total thickness variation of less than about 1.0 μm, the epitaxial wafer comprising a wafer substrate having a front surface and a back surface and an epitaxial layer having an upper surface and a lower surface, the process comprising:

growing the epitaxial layer on the front surface of the wafer substrate to form the epitaxial wafer, the wafer substrate having a total thickness variation of less than about 1.0 μm, and the front surface of the wafer substrate and the lower surface of the epitaxial layer forming an interface;

generating thickness profile data for the epitaxial wafer, said thickness profile data generation comprising measuring the distance between the back surface of the wafer substrate and the upper surface of the epitaxial layer at discrete positions on said upper surface;

determining the amount of stock to be removed at each of said discrete positions to reduce the total thickness variation of the epitaxial wafer, said determination comprising use of an algorithm operating on the thickness profile data and a target thickness value, $T_t$; and removing stock from the upper surface of the epitaxial layer to reduce the total thickness variation of the epitaxial wafer to no more than about 1.0 μm, the amount of stock being removed at each of said discrete positions being based upon said determination.

2. The process of claim 1 wherein the epitaxial wafer has a total thickness variation of less than about 0.7 μm after the stock removal step.

3. The process of claims wherein the epitaxial wafer has a total thickness variation of less than about 0.2 μm after the stock removal step.

4. The process of claim 1 wherein the wafer substrate has a total thickness variation of less than about 0.5 μm.

5. The process of claim 1 wherein at least about 1.0 μm of stock is removed from the epitaxial layer during the stock removal step.

6. The process of claim 1 wherein the epitaxial wafer is polished after the stock removal step.

7. The process of claim 1 wherein the thickness profile data is generated by measuring the capacitance of the epitaxial wafer at said discrete positions, and stock is removed by etching the upper surface of the epitaxial layer of the epitaxial wafer with a plasma.

8. A process for the preparation of an epitaxial wafer having a total thickness variation of less than about 1.0 μm, the process comprising:

generating thickness profile data for at least a first epitaxial wafer; said first epitaxial wafer comprising a first wafer substrate having a front surface and a back surface and a first epitaxial layer having an upper surface and a lower surface, the front surface of the first wafer substrate and the lower surface of the first epitaxial layer forming an interface; and said thickness profile data generation comprising measuring the distance between the upper surface of the first epitaxial layer and the back surface of the first wafer substrate at discrete positions on said upper surface;

preparing a thickness profile data average from the thickness profile data generated from at least the first epitaxial wafer;

growing an epitaxial layer on a front surface of a second wafer substrate to form a second epitaxial wafer; the second epitaxial wafer comprising the second wafer substrate having a front surface and a back surface, and the epitaxial layer having an upper surface and a lower surface, the front surface of the second wafer substrate and the lower surface of the epitaxial layer forming an interface;

determining the amount of stock to be removed at each of said discrete positions to reduce the total thickness variation of the second epitaxial wafer, said determination comprising use of an algorithm operating on the thickness profile data average and a target thickness value, $T_t$; and removing stock from the upper surface of the epitaxial layer of the second epitaxial wafer to reduce the total thickness variation of the second epitaxial wafer to no more than about 1.0 μm, the amount of stock being removed at each of said discrete positions being based upon said determination.

9. The process of claim 8 wherein the second epitaxial wafer has a total thickness variation of less than about 0.7 μm after the stock removal step.

10. The process of claim 8 wherein the second epitaxial wafer has a total thickness variation of less than about 0.2 μm after the stock removal step.

11. The process of claim 8 wherein the second wafer substrate has a total thickness variation of less than about 0.5 μm.

12. The process of claim 8 wherein at least about 1.0 μm of stock is removed from the epitaxial layer during the stock removal step.

13. The process of claim 8 wherein the second epitaxial wafer is polished after the stock removal step.

14. The process of claim 8 wherein the thickness profile data is generated by measuring the capacitance of at least the first epitaxial wafer at said discrete positions, and stock is removed by etching the upper surface of the epitaxial layer of the second epitaxial wafer with a plasma.

15. A process for the preparation of an epitaxial wafer having a total thickness variation of less than about 1.0 μm, the process comprising:

generating thickness profile data for at least a first epitaxial wafer; said first epitaxial wafer comprising a first wafer substrate having a front surface and a back surface and a first epitaxial layer having an upper surface and a lower surface, the front surface of the first wafer substrate and the lower surface of the first epitaxial layer forming an interface; and said thickness profile data generation comprising measuring the distance between the upper surface of the first epitaxial layer and the back surface of the first wafer substrate at discrete positions on said upper surface;

preparing a thickness profile data average from the thickness profile data generated from at least the first epitaxial wafer;

determining the amount of stock to be removed from discrete positions on a front surface of a second wafer substrate, said second wafer substrate having a front surface and a back surface, and said determination comprising use of an algorithm operating on the thickness profile data average and a target thickness value, $T_t$;

removing stock from the front surface of the second wafer substrate to create a sculpted surface, the amount of stock being removed at each of said discrete positions being based upon said determination; and growing an epitaxial layer on the front surface of the second wafer substrate to form a second epitaxial wafer.

16. The process of claim 15 wherein the second epitaxial wafer has a total thickness variation of less than about 0.7 μm.

17. The process of claim 15 wherein the second epitaxial wafer has a total thickness variation of less than about 0.2 μm.

18. The process of claim 15 wherein the second wafer substrate has a total thickness variation of less than about 0.5 μm.

19. The process of claim 15 wherein the second wafer substrate is polished after the stock removal step.

20. The process of claim 15 wherein the thickness profile data is generated by measuring the capacitance of at least the first epitaxial wafer at said discrete positions, and stock is removed by etching the front surface of the second substrate wafer with a plasma.

21. A process for the selective removal of an edge crown of an epitaxial wafer, the epitaxial wafer comprising a wafer substrate having a front surface and a back surface and an epitaxial layer having an upper surface and a lower surface, the process comprising:

growing the epitaxial layer on the front surface of the wafer substrate to form the epitaxial wafer, the wafer substrate having a total thickness variation of less than about 1.0 μm, and the front surface of the wafer substrate and the lower surface of the epitaxial layer forming an interface;

generating thickness profile data for the region of the epitaxial wafer upon which the edge crown is situated, said thickness profile data generation comprising measuring the distance between the back surface of the epitaxial wafer and the upper surface of the epitaxial layer at discrete positions on said upper surface;

determining the amount of stock to be removed at each of said discrete positions to substantially eliminate the edge crown, said determination comprising use of an algorithm operating on the thickness profile data and a target thickness value, $T_t$; and removing stock from the upper surface of the epitaxial layer to substantially eliminate the edge crown, the amount of stock being removed at each of said discrete positions being based upon said determination.

22. The process of claim 21 wherein the epitaxial wafer is polished after the stock removal step.

23. The process of claim 21 wherein the thickness profile data is generated by measuring the capacitance of the epitaxial wafer at said discrete positions, and stock is removed by etching the upper surface of the epitaxial layer of the epitaxial wafer with a plasma.

24. A process for the preparation of an epitaxial wafer having a site total indicated reading of less than about 1.0 μm, the epitaxial wafer comprising a wafer substrate having a front surface and a back surface and an epitaxial layer having an upper surface and a lower surface, the process comprising:

growing the epitaxial layer on the front surface of the wafer substrate to form the epitaxial wafer, the wafer substrate having a site total indicated reading of less than about 1.0 μm, and the front surface of the wafer substrate and the lower surface of the epitaxial layer forming an interface;

generating thickness profile data for the epitaxial wafer, said thickness profile data generation comprising measuring the distance between the back surface of the wafer substrate and the upper surface of the epitaxial layer at discrete positions on said upper surface;

determining the amount of stock to be removed at each of said discrete positions to reduce the site total indicated reading of the epitaxial wafer, said determination comprising use of an algorithm operating on the thickness profile data and a target thickness value, $T_t$; and removing stock from the upper surface of the epitaxial layer to reduce the site total indicated reading of the epitaxial wafer to no more than about 1.0 μm, the amount of stock being removed at each of said discrete positions being based upon said determination.

25. The process of claim 24 wherein the epitaxial wafer has a site total indicated reading of less than about 0.5 μm after the stock removal step.

26. The process of claim 24 wherein the epitaxial wafer has a site total indicated reading of less than about 0.2 μm after the stock removal step.

27. The process of claim 24 wherein the wafer substrate has a site total indicated reading of less than about 0.5 μm.

28. The process of claim 24 wherein at least about 1.0 μm of stock is removed from the epitaxial layer during the stock removal step.

29. The process of claim 24 wherein the epitaxial wafer is polished after the stock removal step.

30. The process of claim 24 wherein the thickness profile data is generated by measuring the capacitance of the epitaxial wafer at said discrete positions, and stock is removed by etching the upper surface of the epitaxial layer of the epitaxial wafer with a plasma.

31. A process for the preparation of an epitaxial wafer having a site total indicated reading of less than about 1.0 μm, the process comprising:

generating thickness profile data for at least a first epitaxial wafer; said first epitaxial wafer comprising a first wafer substrate having a front surface and a back surface and a first epitaxial layer having an upper surface and a lower surface, the front surface of the first wafer substrate and the lower surface of the first epitaxial layer forming an interface; and said thickness profile data generation comprising measuring the distance between the upper surface of the first epitaxial layer and the back surface of the first wafer substrate at discrete positions on said upper surface;

preparing a thickness profile data average from the thickness profile data generated from at least the first epitaxial wafer;

growing an epitaxial layer on a front surface of a second wafer substrate to form a second epitaxial wafer; the second epitaxial wafer comprising the second wafer substrate having a front surface and a back surface, and the epitaxial layer having an upper surface and a lower surface, the front surface of the second wafer substrate and the lower surface of the epitaxial layer forming an interface;

determining the amount of stock to be removed at each of said discrete positions to reduce the site total indicated reading of the second epitaxial wafer, said determination comprising use of an algorithm operating on the thickness profile data average and a target thickness value, $T_t$; and removing stock from the upper surface of the epitaxial layer of the second epitaxial wafer to reduce the site total indicated reading of the second epitaxial wafer to no more than about 1.0 μm, the amount of stock being removed at each of said discrete positions being based upon said determination.

32. The process of claim 31 wherein the second epitaxial wafer has a site total indicated reading of less than about 0.5 μm after the stock removal step.

33. The process of claim 31 wherein the second epitaxial wafer has a site total indicated reading of less than about 0.2 μm after the stock removal step.

34. The process of claim 31 wherein the second wafer substrate has a site total indicated reading of less than about 0.5 μm.

35. The process of claim 31 wherein at least about 1.0 μm of stock is removed from the epitaxial layer during the stock removal step.

36. The process of claim 31 wherein the second epitaxial wafer is polished after the stock removal step.

37. The process of claim 31 wherein the thickness profile data is generated by measuring the capacitance of at least the first epitaxial wafer at said discrete positions, and stock is removed by etching the upper surface of the epitaxial layer of the second epitaxial wafer with a plasma.

38. A process for the preparation of an epitaxial wafer having a site total indicated reading of less than about 1.0 μm, the process comprising:

generating thickness profile data for at least a first epitaxial wafer; said first epitaxial wafer comprising a first wafer substrate having a front surface and a back surface and a first epitaxial layer having an upper surface and a lower surface, the front surface of the first wafer substrate and the lower surface of the first epitaxial layer forming an interface; and said thickness profile data generation comprising measuring the distance between the upper surface of the first epitaxial layer and the back surface of the first wafer substrate at discrete positions on said upper surface;

preparing a thickness profile data average from the thickness profile data generated from at least the first epitaxial wafer;

determining the amount of stock to be removed from discrete positions on a front surface of a second wafer substrate, said second wafer substrate having a front surface and a back surface, and said determination comprising use of an algorithm operating on the thickness profile data average and a target thickness value, $T_t$;

removing stock from the front surface of the second wafer substrate to create a sculpted surface, the amount of stock being removed at each of said discrete positions being based upon said determination; and growing an epitaxial layer on the front surface of the second wafer substrate to form a second epitaxial wafer.

39. The process of claim 38 wherein the second epitaxial wafer has a site total indicated reading of less than about 0.5 μm.

40. The process of claim 38 wherein the second epitaxial wafer has a site total indicated reading of less than about 0.2 μm.

41. The process of claim 38 wherein the second wafer substrate has a site total indicated reading of less than about 0.5 μm.

42. The process of claim 38 wherein the second wafer substrate is polished after the stock removal step.

43. The process of claim 38 wherein the thickness profile data is generated by measuring the capacitance of at least the first epitaxial wafer at said discrete positions, and stock is removed by etching the front surface of the second substrate wafer with a plasma.

44. A process for the selective removal of an edge crown of an epitaxial wafer, the epitaxial wafer comprising a wafer substrate having a front surface and a back surface and an epitaxial layer having an upper surface and a lower surface, the process comprising:

growing the epitaxial layer on the front surface of the wafer substrate to form the epitaxial wafer, the wafer substrate having a site total indicated reading of less than about 1.0 μm, and the front surface of the wafer substrate and the lower surface of the epitaxial layer forming an interface;

generating thickness profile data for the region of the epitaxial wafer upon which the edge crown is situated, said thickness profile data generation comprising measuring the distance between the back surface of the epitaxial wafer and the upper surface of the epitaxial layer at discrete positions on said upper surface;

determining the amount of stock to be removed at each of said discrete positions to substantially eliminate the edge crown, said determination comprising use of an algorithm operating on the thickness profile data and a target thickness value, $T_t$; and removing stock from the upper surface of the epitaxial layer to substantially eliminate the edge crown, the amount of stock being removed at each of said discrete positions being based upon said determination.

45. The process of claim 44 wherein the epitaxial wafer is polished after the stock removal step.

46. The process of claim 44 wherein the thickness profile data is generated by measuring the capacitance of the epitaxial wafer at said discrete positions, and stock is removed by etching the upper surface of the epitaxial layer of the epitaxial wafer with a plasma.

* * * * *

UNITED STATES PATENT AND TRADEMARK OFFICE
CERTIFICATE OF CORRECTION

PATENT NO. : 6,030,887
DATED : February 29, 2000
INVENTOR(S) : Ankur H. Desai, David L. Vadnais, Robert W. Standley It is certified that error appears in the above-identified patent and that said Letters Patent is hereby corrected as shown below:

In column 11, claim 3, line 36 "claims wherein" should read -- claim 1 wherein --.

Signed and Sealed this

Twenty-ninth Day of May, 2001

*Attest:*

NICHOLAS P. GODICI

*Attesting Officer*     *Acting Director of the United States Patent and Trademark Office*